(12) United States Patent
Ma et al.

(10) Patent No.: US 11,450,724 B2
(45) Date of Patent: Sep. 20, 2022

(54) DISPLAY PANEL, METHOD OF MANUFACTURING SAME, AND DISPLAY DEVICE COMPRISING POWER LINES

(71) Applicant: WUHAN CHINA STAR OPTOELECTRONICS SEMICONDUCTOR DISPLAY TECHNOLOGY CO., LTD., Hubei (CN)

(72) Inventors: Weixin Ma, Hubei (CN); Caiqin Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 149 days.

(21) Appl. No.: 16/769,096

(22) PCT Filed: Nov. 5, 2019

(86) PCT No.: PCT/CN2019/115690
§ 371 (c)(1),
(2) Date: Jun. 2, 2020

(87) PCT Pub. No.: WO2021/031364
PCT Pub. Date: Feb. 25, 2021

(65) Prior Publication Data
US 2021/0074792 A1    Mar. 11, 2021

(30) Foreign Application Priority Data
Aug. 20, 2019  (CN) .......................... 201910767968.X

(51) Int. Cl.
*H01L 29/12* (2006.01)
*H01L 27/32* (2006.01)
(Continued)

(52) U.S. Cl.
CPC ...... *H01L 27/3276* (2013.01); *H01L 27/3246* (2013.01); *H01L 27/3265* (2013.01);
(Continued)

(58) Field of Classification Search
CPC ............ H01L 27/3265; H01L 27/3246; H01L 27/3276; H01L 51/56; G09G 3/3258;
(Continued)

(56) References Cited

U.S. PATENT DOCUMENTS

2019/0081270 A1*  3/2019  Kim ................... H01L 27/329
2019/0123126 A1*  4/2019  Song .................. H01L 27/3258
2020/0091195 A1*  3/2020  Chung ................ H01L 27/1255

FOREIGN PATENT DOCUMENTS

CN   107871757 A    4/2018
CN   109037273 A    12/2018
(Continued)

*Primary Examiner* — Phuc T Dang
(74) *Attorney, Agent, or Firm* — Hamre, Schumann, Mueller & Larson, P.C.

(57) ABSTRACT

A display panel, a method of manufacturing the same, and a display device. The display panel includes a substrate, and a first metal layer, an interlayer dielectric layer, and a second metal layer disposed away from the substrate. The first metal layer includes a preset along the preset a first power line extending in a direction, a via hole is formed in the interlayer dielectric layer, and the second metal layer includes a second power line extending in a predetermined direction, and the second power line is located above the first power line and passes through the lead The through hole is electrically connected to the first power line.

16 Claims, 4 Drawing Sheets

(51) Int. Cl.
*H01L 51/56* (2006.01)
*G09G 3/3258* (2016.01)

(52) U.S. Cl.
CPC ........... *H01L 51/56* (2013.01); *G09G 3/3258* (2013.01); *G09G 2320/0233* (2013.01); *G09G 2330/02* (2013.01); *H01L 2227/323* (2013.01)

(58) Field of Classification Search
CPC ........ G09G 2330/0233; G09G 2330/02; G01L 2227/323
USPC .......................................................... 257/71
See application file for complete search history.

(56) References Cited

FOREIGN PATENT DOCUMENTS

| | | |
|---|---|---|
| CN | 110047895 A | 7/2019 |
| KR | 1020080104875 A | 12/2008 |

\* cited by examiner

DISPLAY PANEL, METHOD OF MANUFACTURING SAME, AND DISPLAY DEVICE COMPRISING POWER LINES

FIELD OF INVENTION

The present disclosure relates to the field of display technologies, and more particularly to a display panel, a method of manufacturing the same, and a display device.

BACKGROUND OF INVENTION

Active-matrix organic light emitting diode (AMOLED) panels have gradually become a new generation display technology due to its high contrast, wide color gamut, low power consumption, and foldability.

However, in the AMOLED panel, when a pixel driving circuit drives a pixel unit to emit light, brightness of the AMOLED panel closer to a driver chip (IC) is inconsistent with brightness of the AMOLED panel far from the driver chip due to an ohmic voltage drop on a power line (VDD line). This affects display uniformity of the panel.

SUMMARY OF INVENTION

An object of the present application is to provide a display panel, a method of manufacturing the same, and a display device to reduce impedance of a power line, thereby reducing influence of an ohmic voltage drop of the power line on display uniformity of a panel.

In order to solve the above issues, an embodiment of the present invention provides a display panel. The display panel comprises a substrate; a first metal layer disposed on the substrate, wherein the first metal layer comprises a first power line extending in a predetermined direction; an interlayer dielectric layer disposed on the substrate and covering the first metal layer, wherein the interlayer dielectric layer is provided with a via hole; and a second metal layer disposed on the interlayer dielectric layer, wherein the second metal layer comprises a second power line extending along the predetermined direction, and the second power line is disposed above the first power line and electrically connected to the first power line through the via hole.

In an embodiment of the present invention, the first metal layer further comprises a third power line disposed cross the first power line, and the third power line is electrically connected to the second power line through the via hole.

In an embodiment of the present invention, the second metal layer further comprises a fourth power line disposed cross the second power line, the fourth power line is electrically connected to the first power line through the via hole.

In an embodiment of the present invention, the first metal layer further comprises a fifth power line disposed cross the first power line, the fifth power line is positioned below the fourth power line and is electrically connected to the fourth power line through the via hole.

In an embodiment of the present invention, the first power line and the fifth power line constitute a first power line group, the second power line and the fourth power line constitute a second power line group, and shapes of the first power line group and the second power line group are all mesh.

In an embodiment of the present invention, the display panel further comprises a third metal layer and an insulating layer sequentially away from the substrate, the third metal layer and the insulating layer are disposed between the substrate and the first metal layer, the third metal layer comprises a first electrode and a second electrode, and the second electrode and the first electrode constitute a storage capacitor.

In an embodiment of the present invention, the display panel further comprises a thin film transistor disposed on the substrate, the thin film transistor comprises a gate, a source, and a drain, the gate is disposed on the third metal layer, and the source and the drain are disposed on the second metal layer.

In an embodiment of the present invention, the display panel further comprises a planarization layer and a pixel defining layer, the planarization layer is disposed on the interlayer dielectric layer and covers the second metal layer, and the pixel defining layer is disposed on the planarization layer.

In order to solve the above issues, an embodiment of the present invention provides a method of manufacturing a display panel, comprising: providing a substrate; forming a first metal layer on the substrate, wherein the first metal layer comprises a first power line extending in a predetermined direction; forming an interlayer dielectric layer on the substrate on which the first metal layer is formed and forming a via hole on the interlayer dielectric layer; and forming a second metal layer on the interlayer dielectric layer, wherein the second metal layer comprises a second power line extending along the predetermined direction, and the second power line is disposed above the first power line and electrically connected to the first power line through the via hole.

In an embodiment of the present invention, the first metal layer further comprises a third power line disposed cross the first power line, forming the first metal layer on the substrate further comprises: laying a first metal material layer on the substrate; and etching the first metal material layer to obtain a patterned first metal layer, wherein the first metal layer comprises the first power line and the third power line disposed cross with each other.

In an embodiment of the present invention, the second metal layer further comprises a fourth power line disposed cross the second power line, forming the second metal layer on the interlayer dielectric layer further comprises: laying a second metal material layer on the interlayer dielectric layer; and etching the second metal material layer to obtain a patterned second metal layer, wherein the second metal layer comprises the second power line and the fourth power line disposed cross with each other.

In order to solve the above issues, an embodiment of the present invention provides a display device comprises a display panel, the display panel comprising: a substrate; a first metal layer disposed on the substrate, wherein the first metal layer comprises a first power line extending in a predetermined direction; an interlayer dielectric layer disposed on the substrate and covering the first metal layer, wherein the interlayer dielectric layer is provided with a via hole; and a second metal layer disposed on the interlayer dielectric layer, wherein the second metal layer comprises a second power line extending along the predetermined direction, and the second power line is disposed above the first power line and electrically connected to the first power line through the via hole.

In an embodiment of the present invention, the first metal layer further comprises a third power line disposed cross the first power line, and the third power line is electrically connected to the second power line through the via hole.

In an embodiment of the present invention, the second metal layer further comprises a fourth power line disposed cross the second power line, the fourth power line is electrically connected to the first power line through the via hole.

In an embodiment of the present invention, the first metal layer further comprises a fifth power line disposed cross the first power line, the fifth power line is positioned below the fourth power line and is electrically connected to the fourth power line through the via hole.

In an embodiment of the present invention, the first power line and the fifth power line constitute a first power line group, the second power line and the fourth power line constitute a second power line group, and shapes of the first power line group and the second power line group are all mesh.

In an embodiment of the present invention, the display panel further comprises a third metal layer and an insulating layer sequentially away from the substrate, the third metal layer and the insulating layer are disposed between the substrate and the first metal layer, the third metal layer comprises a first electrode, the first metal layer further comprises a second electrode, and the second electrode and the first electrode constitute a storage capacitor.

In an embodiment of the present invention, the display panel further comprises a thin film transistor disposed on the substrate, the thin film transistor comprises a gate, a source, and a drain, the gate is disposed on the third metal layer, and the source and the drain are disposed on the second metal layer.

In an embodiment of the present invention, the display panel further comprises a planarization layer and a pixel defining layer, the planarization layer is disposed on the interlayer dielectric layer and covers the second metal layer, and the pixel defining layer is disposed on the planarization layer.

Beneficial effects of an embodiment of the present invention are that: the display panel according to an embodiment of the present application comprises a substrate, and a first metal layer, an interlayer dielectric layer, and a second metal layer sequentially disposed away from the substrate. The first metal layer includes a first power line extending along a predetermined direction, the interlayer dielectric layer is provided with a via hole, the second metal layer includes a second power line extending along the predetermined direction, and the second power line is disposed above the first power line and electrically connected to the first power line through the via hole. In this way, by designing a power line in a pixel driving circuit to have a two-layer structure, impedance of the power line can be reduced, thereby reducing an ohmic voltage drop of the power line and improving display uniformity of the display panel.

DESCRIPTION OF DRAWINGS

In order to more clearly illustrate the technical solutions in the embodiments of the present invention, the drawings used in the description of the embodiments will be briefly described below. Obviously, the drawings in the following description are only some embodiments of the present invention. Other drawings can also be obtained from those skilled in the art based on these drawings without paying any creative effort.

DETAILED DESCRIPTION OF PREFERRED EMBODIMENTS

The present application will be further described in detail below with reference to the accompanying drawings and embodiments. It is specifically noted that the following examples are merely illustrative of the present application but are not intended to limit the scope of the application. In the same manner, the following embodiments are only partial embodiments of the present application, and not all the embodiments, and all other embodiments obtained by those skilled in the art without creative efforts are within the scope of the present application.

At present, a pixel driving circuit of an AMOLED panel, for example, a 2T1C circuit, a 6T1C circuit having a thin film transistor threshold voltage compensation function, and a 7T1C circuit. When a driving pixel unit emits light, a power line in the pixel driving circuit is used to transmit a driving voltage supplied from a driving chip to a pixel unit to cause the pixel unit to illuminate. However, due to an ohmic voltage drop on the power line, in the AMOLED panel, brightness of the pixel unit disposed closer to the driving chip is inconsistent with brightness of the pixel unit disposed far from the driving chip, thereby affecting display uniformity of the panel. In order to solve the above technical problem, a technical solution adopted in the present application is by designing a power line in a pixel driving circuit to have a two-layer structure, impedance of the power line can be reduced, thereby reducing an ohmic voltage drop of the power line and improving display uniformity of the display panel.

Figure 1:
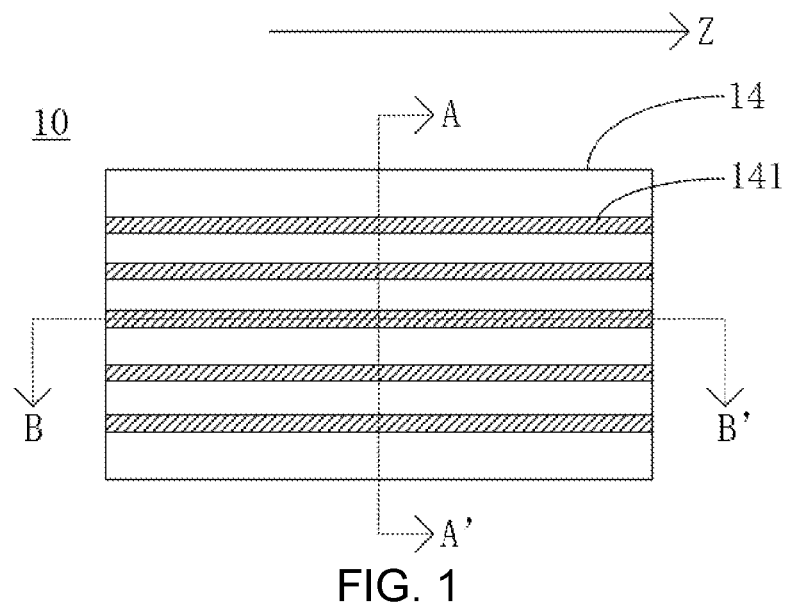
FIG. 1 is a schematic top plan view of a display panel according to an embodiment of the present application.
Figure 2:
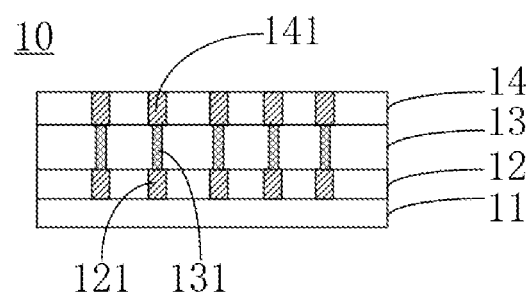
FIG. 2 is a schematic cross-sectional view taken along line A-A' of FIG. 1.
Figure 3:
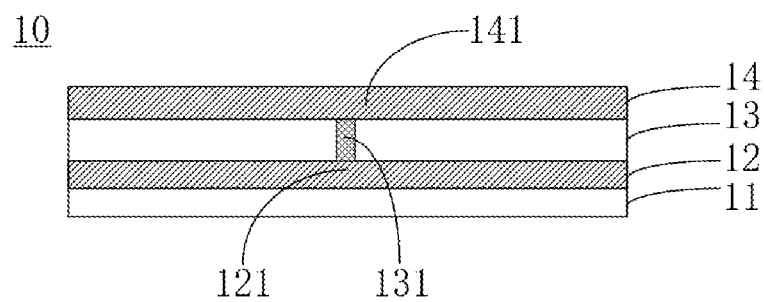
FIG. 3 is a schematic cross-sectional view taken along line B-B' of FIG. 1.

Referring to FIG. 1 to FIG. 3, FIG. 1 is a schematic top plan view of a display panel according to an embodiment of the present application, FIG. 2 is a schematic cross-sectional view taken along line A-A' of FIG. 1, and FIG. 3 is a schematic cross-sectional view taken along line B-B' of FIG. 1. As shown in FIG. 1 to FIG. 3, a display panel 10 includes a substrate 11, and a first metal layer 12, an interlayer dielectric layer 13, and a second metal layer 14 sequentially disposed away from the substrate 11.

The first metal layer 12 includes a first power line 121 extending along a predetermined direction Z. The interlayer dielectric layer 13 is provided with a via hole 131. The second metal layer 14 includes a second power line 141 extending along the predetermined direction Z. The second power line 141 is disposed above the first power line 121 and is electrically connected to the first power line 121 through the via hole 131.

Specifically, the substrate 11 may be a glass substrate or a rigid resin substrate or may be a flexible substrate for preparing a flexible display panel. Material of the first metal layer 12 and material of the second metal layer 14 may be material having a low electrical resistivity such as aluminum, copper, or silver. Material of the interlayer dielectric layer 13 may be an insulating material such as silicon nitride or silicon oxide.

In the embodiment, the via hole 131 is filled with material having a low resistivity, such as indium tin oxide, aluminum, copper, silver, etc., for achieving a conductive connection between the first power line 121 and the second power line 141. As such, the first power line 121 and the second power line 141 constitute a two-layer power line. Compared with a single-layer power line, the two-layer power line has a smaller impedance, which is advantageous for reducing an ohmic voltage drop on the power line, thereby improving display uniformity of the display panel.

Figure 4:
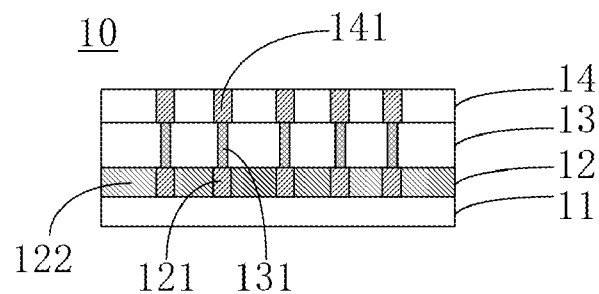
FIG. 4 is a schematic view showing another cross-sectional structure taken along line A-A' of FIG. 1.
Figure 5:
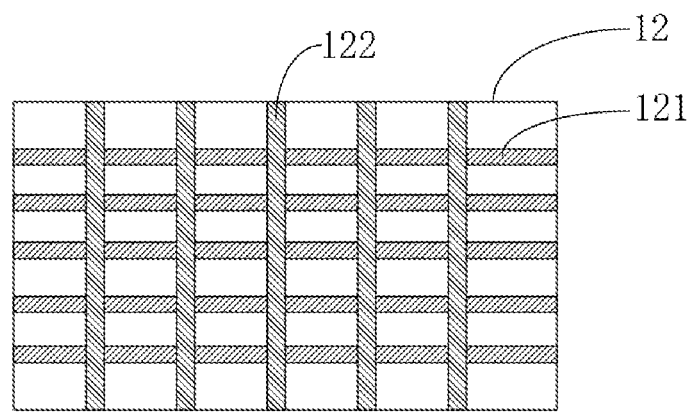
FIG. 5 is a schematic structural view of a first metal layer of FIG. 4.

In one embodiment, as shown in FIG. 4 and FIG. 5, the first metal layer 12 may further include a third power line 122 disposed cross the first power line 121, and the third power line 122 is electrically connected to the second power line 141 through the via hole 131.

It should be noted that a number of the above-mentioned via holes 131 is at least one. The first power line 121 and the third power line 122 may be electrically connected to the second power line 141 through the same or different via holes 131.

Shapes of the first power line 121 and the third power line 122 that are disposed cross with each other may be mesh. For example, the first power line 121 may be disposed to extend in a horizontal direction, and the third power line 122 may be disposed to extend in a vertical direction.

Specifically, the first power line 121 and the third power line 122 that are disposed cross with each other and the second power line 141 disposed above the first power line 121 and parallel to the first power line 121 constitute a two-layer power line, which can further reduce an overall impedance of the power line.

Figure 6:
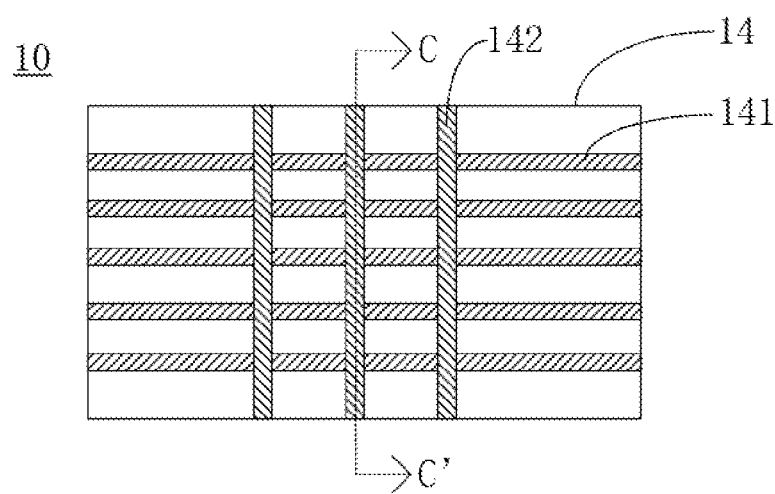
FIG. 6 is another schematic structural view of a display panel according to an embodiment of the present application.
Figure 7:
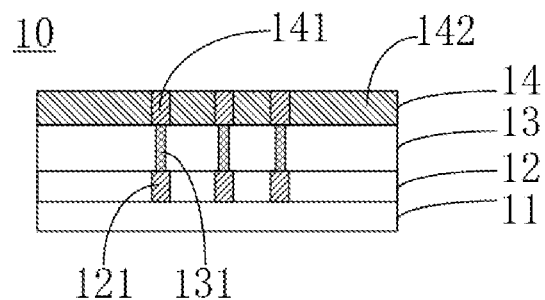
FIG. 7 is a schematic cross-sectional view taken along line C-C' of FIG. 6.

In another embodiment, as shown in FIG. 6 and FIG. 7, the second metal layer 14 may further include a fourth power line 142 disposed cross the second power line 141, and the fourth power line 142 is electrically connected to the first power line 121 through the via hole 131.

Shapes of the second power line 141 and the fourth power line 142 which are disposed cross with each other may be mesh. For example, the second power line 141 may be disposed to extend in the horizontal direction, and the fourth power line 142 may be disposed to extend in the vertical direction.

Specifically, the second power line 141 and the fourth power line 142 that are disposed cross with each other and the first power line 121 disposed below the second power line 141 and parallel to the second power line 141 constitute a two-layer power line, which can further reduce an overall impedance of the power line.

Figure 8:
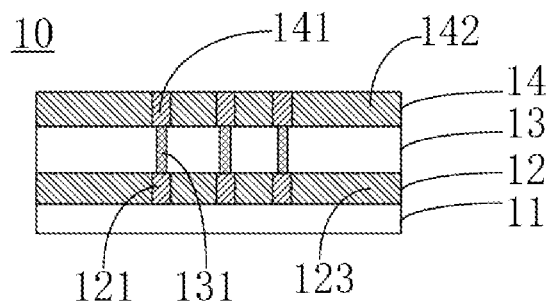
FIG. 8 is a schematic view showing another cross-sectional structure taken along line C-C' of FIG. 7.

Further, as shown in FIG. 8, the first metal layer 12 may further include a fifth power line 123 disposed cross with the first power line 121, and the fifth power line 123 is disposed below the fourth power line 142 and is electrically connected to the fourth power line 142 through the via hole 131.

The first power line 121 and the fifth power line 123 constitute a first power line group, the second power line 141 and the fourth power line 142 constitute a second power line group, and shapes of the first power line group and the second power line group are all mesh. In this way, the first power line group and the second power line group constitute a two-layer power line, which can more effectively reduce impedance of the power line in a pixel driving circuit.

It should be noted that a number of the via hole 131 is at least one, and the second power line 141 and the fourth power line 142 may be electrically connected to the first power line 121 or the fifth power line 123 through the same or different via holes 131.

Figure 9:
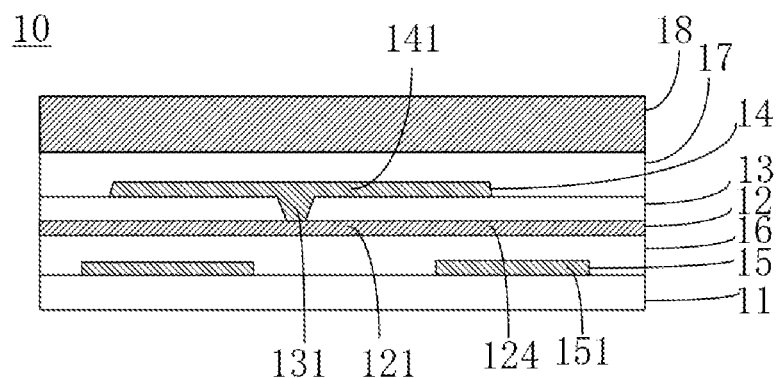
FIG. 9 is another schematic structural view of a display panel according to an embodiment of the present application.
Figure 10:
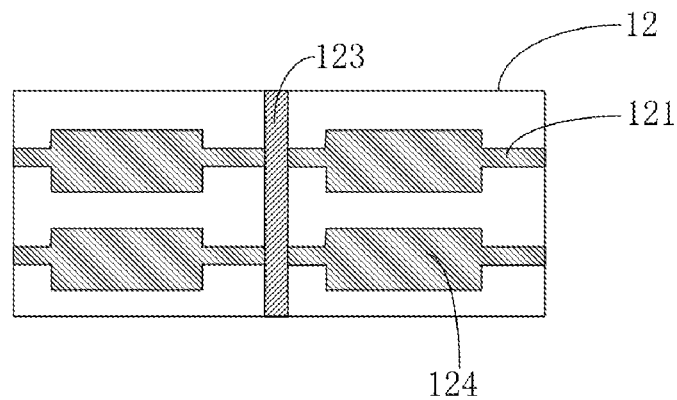
FIG. 10 is a schematic view showing a structure of a first metal layer of FIG. 9.

In a specific embodiment, as shown in FIG. 9, the display panel 10 may further include a third metal layer 15 and an insulating layer 16 which are sequentially away from the substrate 11, and the third metal layer 15 and the insulating layer 16 are disposed between the substrate 11 and the first metal layer 12.

The third metal layer 15 includes a first electrode 151. The first metal layer 12 includes a second electrode 124, and a first power line 121 and a fifth power line 123 that are disposed cross with each other. Specifically, the second electrode 124 is disposed above the first electrode 151 and constitutes a storage capacitor in a pixel driving circuit with the first electrode 151. That is, one-layer power line of the above-mentioned two-layer power line and electrodes of the storage capacitor may be disposed in the same layer, and may be formed by the same patterning process, so that process steps can be reduced, thereby reducing production cost.

In some embodiments, the display panel 10 may further include a thin film transistor (not shown) on the substrate 11. The thin film transistor includes a gate, a source, and a drain. The gate is on the third metal layer 15, and the source and the drain are on the second metal layer 12. That is, one-layer power line of the two-layer power line and the source and the drain of the thin film transistor may be disposed in the same layer, and may be formed by the same patterning process, so that process steps can be further reduced, thereby further reducing production cost.

Specifically, referring to FIG. 9, the display panel 10 may further include a planarization layer 17 and a pixel defining layer 18. The planarization layer 17 is disposed on the interlayer dielectric layer 13 and covers the second metal layer 14, and the pixel defining layer 18 is disposed on the planarization layer 17.

Different from the prior art, the display panel in this embodiment comprises a substrate, and a first metal layer, an interlayer dielectric layer, and a second metal layer sequentially disposed away from the substrate. The first metal layer includes a first power line extending along a predetermined direction, the interlayer dielectric layer is provided with a via hole, the second metal layer includes a second power line extending along the predetermined direction, and the second power line is disposed above the first power line and electrically connected to the first power line through the via hole. In this way, by designing a power line in a pixel driving circuit to have a two-layer structure, impedance of the power line can be reduced, thereby reducing an ohmic voltage drop of the power line and improving display uniformity of the display panel.

Figure 11:
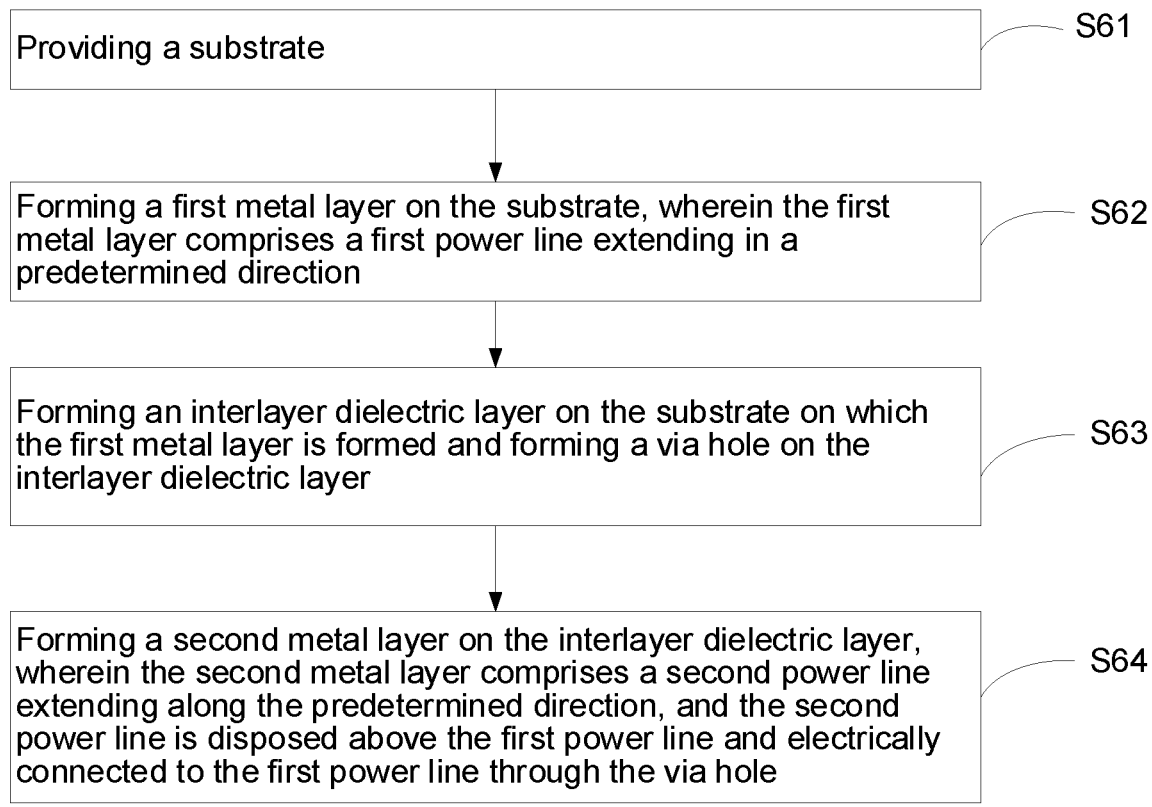
FIG. 11 is a schematic flowchart of a method of manufacturing a display panel according to an embodiment of the present application.

Referring to FIG. 11, FIG. 11 is a schematic flowchart of a method of manufacturing a display panel according to an embodiment of the present application. The method of manufacturing the display panel comprises following steps.

Step S61: providing a substrate.

The substrate may be a glass substrate or a rigid resin substrate, or may be a flexible substrate for preparing a flexible display panel.

Step S62: forming a first metal layer on the substrate, wherein the first metal layer comprises a first power line extending in a predetermined direction.

For example, the first metal layer is formed on the substrate by a process such as sputtering, coating, development, etching, or the like. Material of the first metal layer may be material having a low electrical resistivity such as aluminum, copper, or silver.

Step S63: forming an interlayer dielectric layer on the substrate on which the first metal layer is formed and forming a via hole on the interlayer dielectric layer.

For example, the interlayer insulating layer is formed on the substrate on which the first metal layer is formed by chemical vapor deposition, and the via hole is formed on the interlayer insulating layer by laser etching. A diameter of the via hole may range from 100 to 300 um, material of the interlayer insulating layer may be an insulating material such as silicon nitride or silicon oxide.

Step S64: forming a second metal layer on the interlayer dielectric layer, wherein the second metal layer comprises a second power line extending along the predetermined direction, and the second power line is disposed above the first power line and electrically connected to the first power line through the via hole.

For example, the second metal layer is formed on the interlayer dielectric layer by a process such as sputtering, coating, development, etching, or the like. Material of the second metal layer may be material having a low electrical resistivity such as aluminum, copper, or silver.

In one embodiment of the present invention, the first metal layer further comprises a third power line disposed cross the first power line. The step S62 further comprises:

Sub step A: laying a first metal material layer on the substrate.

Sub step B: etching the first metal material layer to obtain a patterned first metal layer, wherein the first metal layer comprises the first power line and the third power line disposed cross with each other.

Shapes of the first power line and the third power line may be mesh. For example, the first power line may be disposed to extend in a horizontal direction, and the third power line may be disposed to extend in a vertical direction.

Specifically, the first power line and the third power line that are disposed cross with each other and the second power line that is disposed above the first power line and parallel to the first power line constitute a two-layer power line, which can further reduce an overall impedance of the power line.

In another embodiment of the present invention, the second metal layer further comprises a fourth power line disposed cross the second power line. The step S64 further comprises:

Sub step a: laying a second metal material layer on the interlayer dielectric layer.

Sub step b: etching the second metal material layer to obtain a patterned second metal layer, wherein the second metal layer comprises the second power line and the fourth power line disposed cross with each other.

Shapes of the second power line and the fourth power line may be mesh. For example, the second power line may be disposed to extend in a horizontal direction, and the fourth power line may be disposed to extend in a vertical direction.

Specifically, the second power line and the fourth power line that are disposed cross with each other and the first power line that is disposed below the second power line and parallel to the second power line constitute a two-layer power line, which can further reduce an overall impedance of the power line.

Further, the first metal layer may further include a fifth power line that is disposed cross the first power line, and the step S62 may specifically include:

Sub step c: laying a third metal material layer on the substrate.

Sub step d: etching the third metal material layer to obtain a patterned first metal layer, wherein the first metal layer comprises the first power line and the fifth power line disposed cross with each other The first power line and the fifth power line constitute a first power line group, and the second power line and the fourth power line constitute a second power line group. Shapes of the first power line group and the second power line group are both mesh. In this way, the first power line group and the second power line group constitute a two-layer power line, which can more effectively reduce the impedance of the power line in the pixel driving circuit.

In a specific embodiment, the first metal layer may further include a second electrode. Before the step S62, the method may further include:

Step (1): forming a third metal layer on the substrate, wherein the third metal layer comprises the first electrode.

Step (2): forming an insulating layer on the substrate on which the third metal layer is formed.

Correspondingly, the above sub step d can comprise:

Etching the third metal material layer to obtain a patterned first metal layer, wherein the first metal layer comprises the second electrode, and the first power line and the fifth power line disposed cross with each other to form the second metal layer on the insulating layer.

Specifically, the second electrode is disposed above the first electrode and constitutes a storage capacitor in the pixel driving circuit with the first electrode. That is, one-layer power line of the above-mentioned two-layer power line and electrodes of the storage capacitor may be disposed in the same layer, and may be formed by the same patterning process, so that process steps can be reduced, thereby reducing production cost.

In some embodiments, the second metal layer may further include a source and a drain of the thin film transistor, wherein the sub step b may comprise:

Etching the second metal material layer to obtain a patterned second metal layer, wherein the second metal layer comprises the source and the drain of the thin film transistor, and a second power line and a fourth power line disposed cross with each other.

In this way, one-layer power line of the two-layer power line and the source and the drain of the thin film transistor can be disposed in the same layer, and can be formed by the same patterning process, thereby further reducing process steps and further reducing production cost.

Different from the prior art, the method of manufacturing the display panel in this embodiment is provided by designing a power line in a pixel driving circuit to have a two-layer structure, impedance of the power line can be reduced, thereby reducing an ohmic voltage drop of the power line and improving display uniformity of the display panel.

Figure 12:
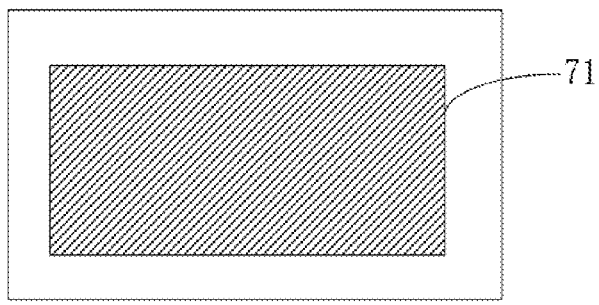
FIG. 12 is a schematic structural view of a display device according to an embodiment of the present application.

Referring to FIG. 12, FIG. 12 is a schematic structural view of a display device according to an embodiment of the present application. The display device 70 includes the display panel 71 of any of the above embodiments.

Specifically, the display panel 71 comprises a substrate, and a first metal layer, an interlayer dielectric layer, and a second metal layer sequentially disposed away from the substrate. The first metal layer includes a first power line extending along a predetermined direction, the interlayer dielectric layer is provided with a via hole, the second metal layer includes a second power line extending along the predetermined direction, and the second power line is disposed above the first power line and electrically connected to the first power line through the via hole.

Different from the prior art, the display device in this embodiment is provided by designing a power line in a pixel driving circuit to have a two-layer structure, impedance of the power line can be reduced, thereby reducing an ohmic voltage drop of the power line and improving display uniformity of the display panel.

The above is only the preferred embodiment of the present application and is not intended to limit the present application. Any modifications, equivalent substitutions, and improvements made within the spirit and principles of the present application are intended to be included within the scope of the present application.

What is claimed is:

1. A display panel, comprising:
   a substrate;
   a first metal layer disposed on the substrate, wherein the first metal layer comprises a first power line extending in a predetermined direction;
   an interlayer dielectric layer disposed on the substrate and covering the first metal layer, wherein the interlayer dielectric layer is provided with a via hole; and
   a second metal layer disposed on the interlayer dielectric layer, wherein the second metal layer comprises a second power line extending along the predetermined direction, and the second power line is disposed above the first power line and electrically connected to the first power line through the via hole;
   wherein the first metal layer further comprises a third power line disposed cross the first power line, and the third power line is electrically connected to the second power line through the via hole.

2. The display panel according to claim 1, wherein the second metal layer further comprises a fourth power line disposed cross the second power line, the fourth power line is electrically connected to the first power line through the via hole.

3. The display panel according to claim 2, wherein the first metal layer further comprises a fifth power line disposed cross the first power line, the fifth power line is positioned below the fourth power line and is electrically connected to the fourth power line through the via hole.

4. The display panel according to claim 3, wherein the first power line and the fifth power line constitute a first power line group, the second power line and the fourth power line constitute a second power line group, and shapes of the first power line group and the second power line group are all mesh.

5. The display panel according to claim 1, further comprising a third metal layer and an insulating layer sequentially away from the substrate, wherein the third metal layer and the insulating layer are disposed between the substrate and the first metal layer, the third metal layer comprises a first electrode, the first metal layer further comprises a second electrode, and the second electrode and the first electrode constitute a storage capacitor.

6. The display panel according to claim 5, further comprising a thin film transistor disposed on the substrate, wherein the thin film transistor comprises a gate, a source, and a drain, the gate is disposed on the third metal layer, and the source and the drain are disposed on the second metal layer.

7. The display panel according to claim 1, further comprising a planarization layer and a pixel defining layer, wherein the planarization layer is disposed on the interlayer dielectric layer and covers the second metal layer, and the pixel defining layer is disposed on the planarization layer.

8. A method of manufacturing a display panel, comprising:
   providing a substrate;
   forming a first metal layer on the substrate, wherein the first metal layer comprises a first power line extending in a predetermined direction;
   forming an interlayer dielectric layer on the substrate on which the first metal layer is formed and forming a via hole on the interlayer dielectric layer; and
   forming a second metal layer on the interlayer dielectric layer, wherein the second metal layer comprises a second power line extending along the predetermined direction, and the second power line is disposed above the first power line and electrically connected to the first power line through the via hole;
   wherein the first metal layer further comprises a third power line disposed cross the first power line, forming the first metal layer on the substrate further comprises:
   laying a first metal material layer on the substrate; and
   etching the first metal material layer to obtain a patterned first metal layer, wherein the first metal layer comprises the first power line and the third power line disposed cross with each other.

9. The method according to claim 8, wherein the second metal layer further comprises a fourth power line disposed cross the second power line, forming the second metal layer on the interlayer dielectric layer further comprises:
   laying a second metal material layer on the interlayer dielectric layer; and
   etching the second metal material layer to obtain a patterned second metal layer, wherein the second metal layer comprises the second power line and the fourth power line disposed cross with each other.

10. A display device comprising a display panel, the display panel comprising:
    a substrate;
    a first metal layer disposed on the substrate, wherein the first metal layer comprises a first power line extending in a predetermined direction;
    an interlayer dielectric layer disposed on the substrate and covering the first metal layer, wherein the interlayer dielectric layer is provided with a via hole; and
    a second metal layer disposed on the interlayer dielectric layer, wherein the second metal layer comprises a second power line extending along the predetermined direction, and the second power line is disposed above the first power line and electrically connected to the first power line through the via hole;
    wherein the first metal layer further comprises a third power line disposed cross the first power line, and the third power line is electrically connected to the second power line through the via hole.

11. The display device according to claim 10, wherein the second metal layer further comprises a fourth power line disposed cross the second power line, the fourth power line is electrically connected to the first power line through the via hole.

12. The display device according to claim 11, wherein the first metal layer further comprises a fifth power line disposed cross the first power line, the fifth power line is positioned below the fourth power line and is electrically connected to the fourth power line through the via hole.

13. The display device according to claim 12, wherein the first power line and the fifth power line constitute a first power line group, the second power line and the fourth power line constitute a second power line group, and shapes of the first power line group and the second power line group are all mesh.

14. The display device according to claim 10, wherein the display panel further comprises a third metal layer and an insulating layer sequentially away from the substrate, the third metal layer and the insulating layer are disposed between the substrate and the first metal layer, the third metal layer comprises a first electrode, the first metal layer further comprises a second electrode, and the second electrode and the first electrode constitute a storage capacitor.

15. The display device according to claim 14, wherein the display panel further comprises a thin film transistor disposed on the substrate, the thin film transistor comprises a gate, a source, and a drain, the gate is disposed on the third metal layer, and the source and the drain are disposed on the second metal layer.

16. The display device according to claim 10, wherein the display panel further comprises a planarization layer and a pixel defining layer, the planarization layer is disposed on the interlayer dielectric layer and covers the second metal layer, and the pixel defining layer is disposed on the planarization layer.

* * * * *